US008785323B2

United States Patent
Wang

(10) Patent No.: US 8,785,323 B2
(45) Date of Patent: Jul. 22, 2014

(54) METHOD OF FORMING AN INTERCONNECT STRUCTURE HAVING AN ENLARGED REGION

(71) Applicant: Taiwan Semiconductor Manufacturing Company, Ltd., Hsin-Chu (TW)

(72) Inventor: Chien-Jung Wang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/953,418

(22) Filed: Jul. 29, 2013

(65) Prior Publication Data

US 2013/0316073 A1 Nov. 28, 2013

Related U.S. Application Data

(62) Division of application No. 13/534,939, filed on Jun. 27, 2012, now Pat. No. 8,513,115, which is a division of application No. 13/196,423, filed on Aug. 2, 2011, now Pat. No. 8,227,923, which is a division of application No. 12/363,565, filed on Jan. 30, 2009, now Pat. No. 8,013,451, which is a division of application No. 11/743,499, filed on May 2, 2007, now Pat. No. 7,504,731, which is a division of application No. 10/984,050, filed on Nov. 9, 2004, now Pat. No. 7,227,266.

(51) Int. Cl.
*H01L 21/4763* (2006.01)

(52) U.S. Cl.
USPC ............ 438/637; 438/629; 438/639; 438/672

(58) Field of Classification Search
CPC .......................... H01L 23/528; H01L 23/5226
USPC ................. 438/617–624, 637–638, 672–673, 438/700–701; 257/758, 765, 770, 797, 763
See application file for complete search history.

(56) References Cited

U.S. PATENT DOCUMENTS

| 3,838,204 A | 9/1974 | Ahn et al. |
| 4,328,531 A | 5/1982 | Nagashima et al. |
| 5,627,345 A | 5/1997 | Yamamoto et al. |

(Continued)

OTHER PUBLICATIONS

Ogawa, E.T., et al., "Stress-Induced Voiding Under Vias Connected to Wide Cu Metal Leads," IEEE, 40th International Reliability Physics Symposium, 2002, pp. 312-321.

*Primary Examiner* — Dung A. Le
(74) *Attorney, Agent, or Firm* — Slater and Matsil, L.L.P.

(57) ABSTRACT

A method of forming an interconnect structure that may reduce or eliminate stress induced voids is provided. In an embodiment, a via is formed below a conductive line to provide an electrical connection to an underlying conductive region. The conductive line includes a widened region above the via. The widened region serves to reduce or eliminate stress induced voids between the via and the underlying conductive region. In another embodiment, one or more redundant lines are formed extending from a conductive region, such as a contact pad, such that the redundant line does not electrically couple the conductive region to an underlying conductive region. In a preferred embodiment, the redundant lines extend from a conductive region on a side adjacent to a side having a conductive line coupled to a via.

9 Claims, 2 Drawing Sheets

(56) References Cited

U.S. PATENT DOCUMENTS

| | | | |
|---|---|---|---|
| 6,054,770 A | 4/2000 | Toyoda et al. | |
| 6,078,100 A | 6/2000 | Duesman et al. | |
| 6,232,664 B1 * | 5/2001 | Kono | 257/761 |
| 6,307,268 B1 | 10/2001 | Lin | |
| 6,342,733 B1 | 1/2002 | Hu et al. | |
| 6,368,967 B1 | 4/2002 | Besser | |
| 7,504,731 B2 | 3/2009 | Wang | |
| 2002/0076903 A1 | 6/2002 | Kondo et al. | |
| 2003/0197280 A1 | 10/2003 | Davis et al. | |
| 2006/0022787 A1 | 2/2006 | Brennan et al. | |

\* cited by examiner

METHOD OF FORMING AN INTERCONNECT STRUCTURE HAVING AN ENLARGED REGION

This application is a divisional of patent application Ser. No. 13/534,939, entitled "Method of Forming An Interconnect Structure Having An Enlarged Region," filed on Jun. 27, 2012, which is a divisional of patent application Ser. No. 13/196,423, now U.S. Pat. No. 8,227,923, entitled "Interconnect Structure to Reduce Stress Induced Voiding Effect," filed on Aug. 2, 2011, which is a divisional of patent application Ser. No. 12/363,565, now U.S. Pat. No. 8,013,451, entitled "Interconnect Structure to Reduce Stress Induced Voiding Effect," filed on Jan. 30, 2009, which is a divisional of patent application Ser. No. 11/743,499, now U.S. Pat. No. 7,504,731, entitled "Interconnect Structure to Reduce Stress Induced Voiding Effect," filed on May 2, 2007, which is a divisional of patent application Ser. No. 10/984,050, now U.S. Pat. No. 7,227,266, entitled "Interconnect Structure to Reduce Stress Induced Voiding Effect," filed on Nov. 9, 2004, which applications are incorporated herein by reference.

TECHNICAL FIELD

The present invention generally relates to a method of metallization in the fabrication of integrated circuits, and more particularly, to a method and an apparatus for reducing metal void formation caused by stress migration or metal relaxation in the manufacture of integrated circuits.

BACKGROUND

Complementary metal-oxide-semiconductor (CMOS) technology is the dominant semiconductor technology used for the manufacture of ultra-large scale integrated (ULSI) circuits today. Size reduction of the semiconductor structures has provided significant improvement in the speed, performance, circuit density, and cost per unit function of semiconductor chips over the past few decades. Significant challenges, however, are faced as the sizes of CMOS devices continue to decrease.

One such challenge is the fabrication of interconnect structures, e.g., vias. CMOS devices typically include semiconductor structures, such as transistors, capacitors, resistors, and the like, formed on a substrate. One or more conductive layers formed of a metal or metal alloy separated by layers of a dielectric material are formed over the semiconductor structures to interconnect the semiconductor structures and to provide external contacts to the semiconductor structures. Vias are formed in the dielectric layers to provide an electrical connection between metal layers and/or a metal layer and a semiconductor structure.

The vias, particularly vias connecting a metal lead with a thin metal line to an underlying conductive layer, are frequently subjected to significant stress. The stress may result from, for example, the different coefficient of thermal expansion (CTE) between the material filling the via and the surrounding material, e.g., the dielectric layer. The stress frequently causes voids, commonly referred to as stress-induced voids (SIV), wherein the material filling the void separates from the underlying conductive material. The stressed-induced voids may significantly affect the electrical characteristics of the via and may cause the semiconductor structure to fail. Therefore, there is a need for a semiconductor structure that eliminates or reduces the amount of stress, and therefore the stressed-induced voids, in vias.

SUMMARY OF THE INVENTION

These and other problems are generally solved or circumvented, and technical advantages are generally achieved, by preferred embodiments of the present invention, which provides a method and an apparatus for reducing metal void formation caused by stress migration or method relaxation.

In embodiments of the present invention, a new method for eliminating stress buildup at a connection to a large metal area is provided. A large metal area is provided having a protruding small metal tab wherein a connection is to be made from the small metal tab through a via plug to an overlying metal line. Above the via plug, the metal tab widens wherein the wider region prevents or reduces stress-induced voids from forming underlying the via plug.

In another embodiment of the present invention, a new method of reducing stress-induced voids is achieved. A large metal area is provided having a small metal tab protruding from a first side of the large metal area wherein a connection is to be made from the small metal tab through a via plug to an overlying metal line. A redundant small metal tab is added protruding from a second side of the large metal area perpendicular to the first side wherein the redundant small metal tab acts as a vacancy sink to prevent or reduce stress-induced voids from forming underlying the via plug.

In another embodiment of the present invention, an integrated circuit device without interconnect discontinuity is provided. The device comprises a large metal area having a protruding small metal tab wherein a connection is made from the small metal tab through a via plug to an overlying metal line. The area of the metal tab over the via is wider than the metal tab protruding from the large metal area, wherein the wider region prevents or reduces stress-induced voids from forming underlying the via plug thereby avoiding interconnect discontinuity.

In another embodiment of the present invention, an integrated circuit device without interconnect discontinuity is provided. The device comprises a large metal area having a small metal tab protruding from a first side of the large metal area wherein a connection is made from the small metal tab through a via plug to an overlying metal line. A redundant small metal tab protrudes from a second side of the large metal area perpendicular to the first side wherein the redundant small metal tab acts as a vacancy sink to prevent stress-induced voids from forming underlying the via plug thereby avoiding interconnect discontinuity.

In yet another embodiment, a semiconductor structure is provided. The semiconductor structure includes a contact pad and a plurality of conductive lines extending from the contact pad, the plurality of conductive lines including a first conductive line that is not electrically coupled to other conductive features of the semiconductor structure. A via underlies the second conductive line of the plurality of conductive lines.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed herein are merely illustrative of specific ways to make and use the invention, and do not limit the scope of the invention.

Embodiments of the present invention provide methods and device designs for eliminating or reducing stress-induced voids. Embodiments of the present invention are described in reference to forming a via to electrically couple an upper-layer metal contact to an underlying conductive region. Specific shapes and configurations are disclosed, however, it should be appreciated by one of ordinary skill in the art that other shapes and configurations may be used.

Figure 1:
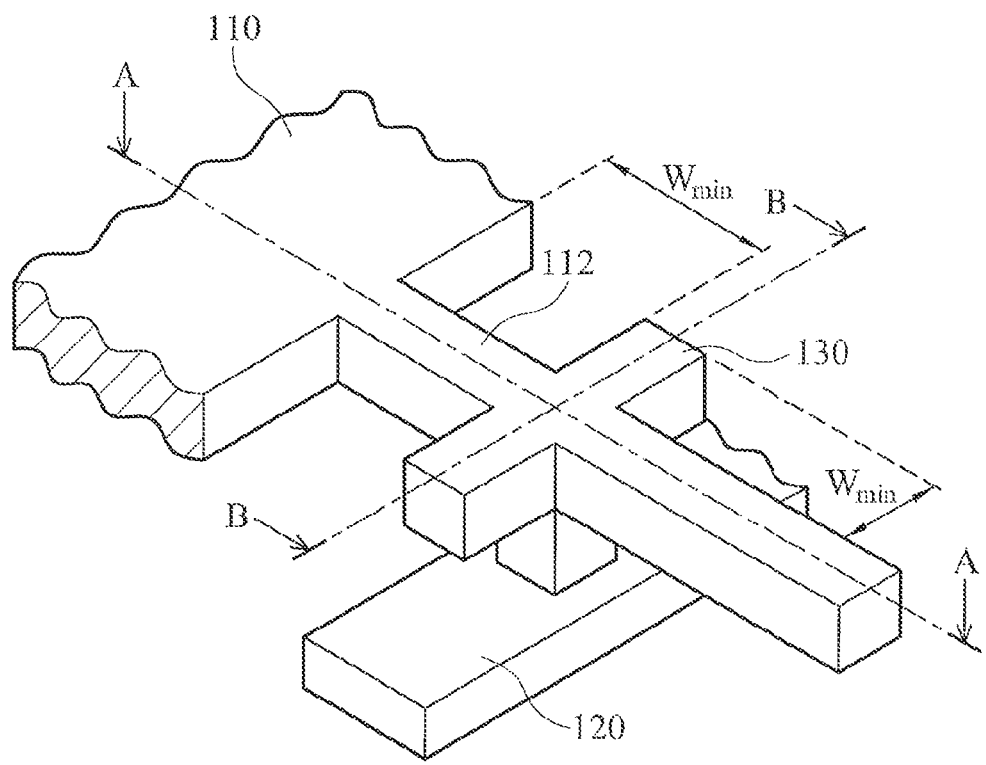
FIG. 1 is a perspective view of an embodiment of the present invention.
Figure 2:
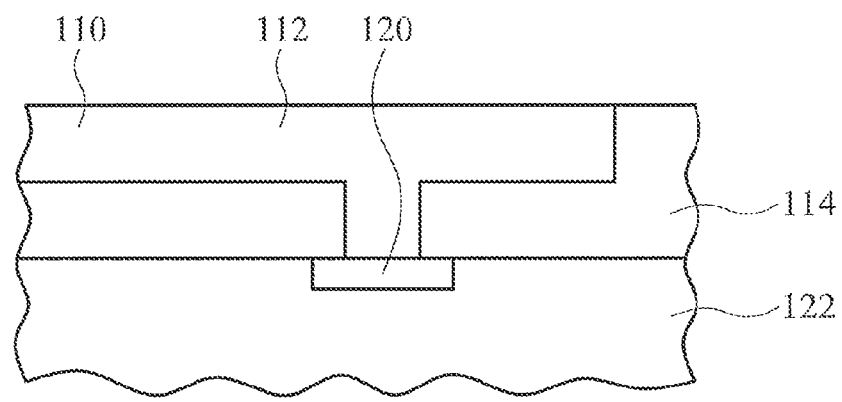
FIG. 2 is a cross-section view along the A-A line of FIG. 1 in accordance with an embodiment of the present invention.
Figure 3:
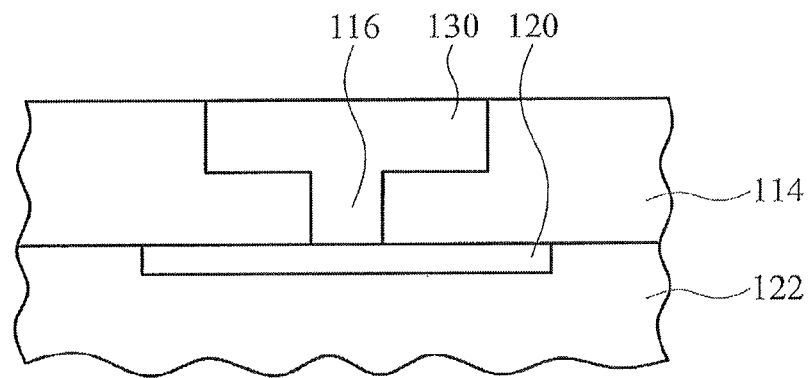
FIG. 3 is a cross-section view along the B-B line of FIG. 1 in accordance with an embodiment of the present invention.

Referring now to FIGS. 1-3, FIG. 1 shows a perspective view of an interconnect structure, and FIGS. 2 and 3 show a cross-sectional view along the A-A and B-B axes, respectively, indicated in FIG. 1. It should be noted that FIG. 1 only illustrates the conductive lines and vias, and that the surrounding dielectric layer has been removed to better illustrate the interconnect structure. The surrounding dielectric layer is shown in FIGS. 2 and 3.

A first conductive region 110 having a thinner conductive line 112 extending therefrom is formed in a first dielectric layer 114. The conductive region 110 may be a portion of a contact pad, a larger conductive line, an interconnect, or the like. The conductive line 112 provides an electrical connection to a via 116. The via 116 is formed through the first dielectric layer 114 to provide an electrical connection to an underlying second conductive region 120 formed in a second dielectric layer 122. Such a structure may be used for providing an electrical connection to metal lines, power distribution, or the like.

In accordance with an embodiment of the present invention, the conductive line 112 is widened in regions 130 above the via 116. In the embodiment illustrated in FIGS. 1-3, the region 130 is shown as a rectangular line such that the longitudinal axis is perpendicular to the longitudinal axis of the conductive line 112. Other shapes and configurations, however, may be used. For example, the region 130 may be elliptical, curved, non-linear, or the like. Furthermore, the region 130 may be configured such that the longitudinal axis of the region 130 is other than perpendicular to the longitudinal axis of the conductive line 112.

In an embodiment, the region 130 is positioned a distance from about 1 to about 50 times $W_{min}$ from the first conductive region 110 and extends on either side of the conductive line 112 for a distance of $W_{min}$, wherein $W_{min}$ is the minimum feature size for a given semiconductor structure. For example, in an embodiment in which the present invention is being used to fabricate a semiconductor device using 130 nm generation designs, a typical $W_{min}$ is about 150 nm to about 250 nm. In this embodiment, the region 130 may extend about 150 nm to about 250 nm on either side of the conductive line 112.

The region 130 is preferably positioned about 1 to about 50 times $W_{min}$ from the conductive region 110, and the conductive line preferably extends about 1 to about 50 times past the region 130. Furthermore, the region 130 may extend farther or shorter on each side of the conductive line 112. The region 130 may or may not extend the same distance on either side of the conductive line 112.

It has been found that the use of a widened area in the conductive line 112 over a via, such as the widened region 130 of the conductive line 112 over the via 116, substantially reduces the amount of stress in the via. This has been found to be particularly true of the stress induced by subsequent heating and cooling cycles and the difference of CTEs between the various types of materials.

Embodiments of the present invention may be formed using any fabrication technology, including etching, single damascene processes, dual-damascene processes, or the like. The elimination or reduction of the stress-induced voids is not necessarily dependent upon the processes used to create the structures disclosed herein, but rather are more dependent upon the shapes of the structures. Accordingly, embodiments of the present invention may be fabricated using any suitable technique.

Figure 4:
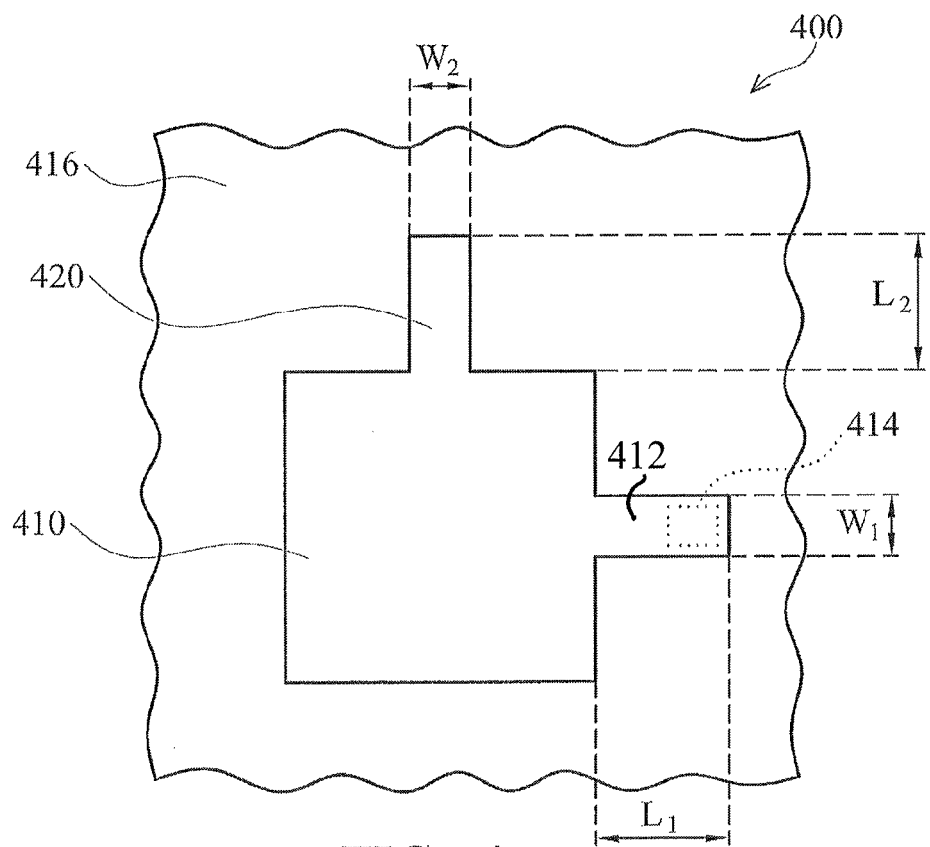
FIG. 4 is a plan view of a contact pad in accordance with an embodiment of the present invention.

Referring now to FIG. 4, there is shown a top view of an interconnect structure 400 in accordance with another embodiment of the present invention. The interconnect structure 400 comprises a contact pad 410 and a conductive line 412 electrically coupling the contact pad 410 to a via 414, illustrated by a dotted line, through a dielectric layer 416. The process of the present invention is particularly useful for copper metallization, but could also be used for other types of metals, such as aluminum. For example, an embodiment of the present invention provides a semiconductor structure having a conductive region formed in a dielectric layer having a plurality of conductive traces extending away from the conductive region, at least one of the conductive traces not being electrically coupled to another conductive region and a via underlies another conductive trace of the plurality of conductive traces.

In this embodiment of the present invention, the stress-migration problem discussed above is solved or reduced by adding a redundant line 420. The redundant line 420 is formed in the dielectric layer 416 in the same manner as the conductive line 412, except that the redundant line 420 does not electrically couple the contact pad 410 to an underlying via. In an embodiment, the redundant line 420 is located along a side of the contact pad 410 adjacent to the side from which the conductive line 412 extends. It is also preferred that the redundant line 420 be located at approximately the middle of the adjacent side. The redundant line 420, however, may be located in other positions and still reduce the stress and stress-induced voids.

In a preferred embodiment, redundant line 420 has a length $L_2$ approximately equal to or larger than the length $L_1$ of the conductive line 412. The width of the redundant line 420 and the conductive line 412, i.e., $W_2$ and $W_1$, respectively, are preferably about the minimum feature size $W_{min}$. The redundant line 420 may be other shapes and sizes.

It should be noted that additional redundant lines may be added to further reduce stress. For example, two or more redundant lines may be placed on one or more sides of the contact pad 410.

While the invention has been particularly shown and described with reference to the preferred embodiments thereof, it will be understood by those skilled in the art that various changes in form and details may be made without departing from the spirit and scope of the invention.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of forming an interconnect structure, the method comprising:
   forming a via through a dielectric layer;
   forming a conductive line in the dielectric layer over the via, the conductive line electrically coupling a conductive region to the via; and
   forming a redundant line in the dielectric layer, the redundant line being in electrical contact to only the conductive region.

2. The method of claim 1, further comprising forming a plurality of redundant lines, each of the redundant lines being in electrical contact to only the conductive region.

3. The method of claim 1, wherein the redundant line extends from a first side of the conductive region and the conductive line extends from a second side of the conductive region, the first side being a different side than the first side.

4. The method of claim 3, wherein the first side is adjacent to the second side.

5. The method of claim 1, wherein a longitudinal axis of the redundant line is substantially perpendicular to a longitudinal axis of the conductive line.

6. The method of claim 1, wherein a width of the redundant line is about equal to a width of the conductive line.

7. The method of claim 1, wherein the width of the redundant line and the conductive line is about equal to a minimum feature size.

8. The method of claim 7, wherein the minimum feature size is about 150 nm to about 250 nm.

9. The method of claim 1, wherein a length of the redundant line is about equal to or greater than a length of the conductive line.

* * * * *

UNITED STATES PATENT AND TRADEMARK OFFICE
CERTIFICATE OF CORRECTION

| | | |
|---|---|---|
| PATENT NO. | : 8,785,323 B2 | Page 1 of 1 |
| APPLICATION NO. | : 13/953418 | |
| DATED | : July 22, 2014 | |
| INVENTOR(S) | : Chien-Jung Wang | |

It is certified that error appears in the above-identified patent and that said Letters Patent is hereby corrected as shown below:

In the Claims

In Col. 6, line 17, claim 3, delete "different side than the first side." and insert --different side than the second side.--

Signed and Sealed this
Seventh Day of October, 2014

Michelle K. Lee
*Deputy Director of the United States Patent and Trademark Office*